US012382585B2

(12) United States Patent
Schwarz et al.

(10) Patent No.: US 12,382,585 B2
(45) Date of Patent: Aug. 5, 2025

(54) METHOD FOR EMBEDDING A COMPONENT IN A PRINTED CIRCUIT BOARD (71) Applicant: AT&S Austria Technologie & Systemtechnik Aktiengesellschaft, Leoben (AT)

(72) Inventors: Timo Schwarz, St. Michael i.O. (AT); Andreas Zluc, Leoben (AT); Gregor Langer, Wölfnitz (AT); Johannes Stahr, St. Lorenzen (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 73 days.

(21) Appl. No.: 16/908,500

(22) Filed: Jun. 22, 2020

(65) Prior Publication Data

US 2020/0323081 A1 Oct. 8, 2020

Related U.S. Application Data (63) Continuation of application No. 15/103,826, filed as application No. PCT/AT2014/050300 on Dec. 12, 2014, now Pat. No. 10,779,413.

(51) Int. Cl.
*H01L 23/00* (2006.01)
*H05K 1/18* (2006.01)
(Continued)

(52) U.S. Cl.
CPC ............ *H05K 1/183* (2013.01); *H01L 24/24* (2013.01); *H01L 24/82* (2013.01); *H05K 1/185* (2013.01);
(Continued)

(58) Field of Classification Search
CPC ...... H05K 1/183; H05K 1/185; H05K 1/0204; H05K 1/05; H05K 3/30; H05K 3/46;
(Continued)

(56) References Cited

U.S. PATENT DOCUMENTS 6,163,049 A 12/2000 Bui
10,187,997 B2 1/2019 Weidinger et al.
(Continued)

FOREIGN PATENT DOCUMENTS

WO 2012100274 A1 8/2012

*Primary Examiner* — Livius R. Cazan
(74) *Attorney, Agent, or Firm* — KPPB LLP (57) ABSTRACT

A method for embedding a component in a printed circuit board or a printed circuit board intermediate product, wherein the printed circuit board or the printed circuit board intermediate product comprises at least one insulating layer made of a prepreg material, and the component is fixed by the resin of the prepreg material, is characterized by the following steps:

providing a combination of the layers of the printed circuit board, or of the printed circuit board intermediate product, wherein this combination includes at least one curable prepreg material;

creating a clearance in the combination for accommodating the component to be embedded; covering at least the region of the clearance with a first temporary carrier layer on a first side of the combination;

positioning the component to be embedded in the clearance by way of the first temporary carrier layer;

covering at least the region of the clearance on the second side of the combination with a second temporary carrier layer;

compressing the combination with the component, curing the curable prepreg material; and removing the temporary carrier layers.

10 Claims, 7 Drawing Sheets (51) Int. Cl.
*H05K 3/30* (2006.01)
*H05K 3/46* (2006.01)
*H05K 1/02* (2006.01)
*H05K 1/05* (2006.01)

(52) U.S. Cl.
CPC ................. *H05K 3/30* (2013.01); *H05K 3/46* (2013.01); *H01L 2224/04105* (2013.01); *H01L 2224/2518* (2013.01); *H01L 2224/48091* (2013.01); *H01L 2224/48247* (2013.01); *H01L 2224/73267* (2013.01); *H01L 2224/96* (2013.01); *H01L 2924/181* (2013.01); *H05K 1/0204* (2013.01); *H05K 1/05* (2013.01); *H05K 3/4602* (2013.01); *H05K 3/4694* (2013.01); *H05K 2201/10106* (2013.01); *H05K 2203/0191* (2013.01); *H05K 2203/1469* (2013.01); *Y10T 29/4913* (2015.01)

(58) Field of Classification Search
CPC ............... H05K 3/4602; H05K 3/4694; H05K 2203/0191; H05K 2203/1469; H05K 3/0014; H05K 1/188; H01L 24/24; H01L 24/82; H01L 2224/04105; H01L 2224/2518; H01L 2224/48091; H01L 2224/48247; H01L 2224/73267; H01L 2224/96; Y10T 29/4913
USPC ................................. 29/832, 829, 825, 592.1
See application file for complete search history.

(56) References Cited

U.S. PATENT DOCUMENTS

| | | | |
|---|---|---|---|
| 10,779,413 | B2 | 9/2020 | Schwarz et al. |
| 2003/0146012 | A1* | 8/2003 | Song ................. H01L 24/82 |
| | | | 174/558 |
| 2005/0048759 | A1 | 3/2005 | Hsu |
| 2007/0209831 | A1* | 9/2007 | Sakamoto ......... H01L 23/49838 |
| | | | 174/262 |
| 2008/0196931 | A1 | 8/2008 | Lee et al. |
| 2009/0001609 | A1* | 1/2009 | Lim ................. H01L 25/0655 |
| | | | 257/E21.705 |
| 2009/0242251 | A1* | 10/2009 | Park ................. H01L 24/29 |
| | | | 29/841 |
| 2009/0277673 | A1* | 11/2009 | Sohn ................. H05K 1/185 |
| | | | 29/829 |
| 2009/0310323 | A1* | 12/2009 | Baek ................. H01L 24/24 |
| | | | 29/829 |
| 2010/0084175 | A1* | 4/2010 | Suzuki ............. H01L 23/49822 |
| | | | 174/260 |
| 2011/0259630 | A1* | 10/2011 | Park ................. H01L 23/5389 |
| | | | 29/841 |
| 2011/0290408 | A1 | 12/2011 | Samejima et al. |
| 2012/0024583 | A1* | 2/2012 | Lee ................. H05K 1/186 |
| | | | 29/852 |
| 2014/0144686 | A1* | 5/2014 | Shimizu ............. H05K 3/4602 |
| | | | 174/258 |
| 2016/0324004 | A1 | 11/2016 | Schwarz et al. |
| 2023/0189448 | A1 | 6/2023 | Weidinger et al. |

* cited by examiner

METHOD FOR EMBEDDING A COMPONENT IN A PRINTED CIRCUIT BOARD

CROSS REFERENCE TO RELATED APPLICATIONS

This application is a continuation application of U.S. application Ser. No. 15/103,826, filed Jun. 10, 2016, which application is a national stage of Application No. PCT/AT2014/050300, filed Dec. 12, 2014, which application claims priority to Austrian Application No. A 50821/2013, filed on Dec. 12, 2013, the disclosures of which are hereby incorporated by reference in their entireties

FIELD OF THE INVENTION

The present invention relates to a method for embedding a component in a printed circuit board, or in a printed circuit board intermediate product, wherein the printed circuit board, or the printed circuit board intermediate product, comprises at least one insulating layer made of a prepreg material, and the component is fixed by the resin of the prepreg material, and to a printed circuit board or a printed circuit board intermediate product.

BACKGROUND OF THE INVENTION

Printed circuit boards are used to fix and electrically connect electronic components and to connect these, in the form of a module, in electronic devices. Printed circuit boards are generally composed of a plurality of alternating layers made of insulating material and conducting material, wherein the layers made of electrically conducting material, such as copper, are structured to form conductor tracks, which are connected to the contact pads of the electronic components and route these accordingly. In addition to fixing and connecting the electronic components to each other, printed circuit boards can additionally assume a static function in an electronic device given the relatively high mechanical stability of the same.

In keeping with the steadily progressing miniaturization of electronic devices, such as mobile telephones, tablet computers and the like, the increasingly smaller electronic components are not only mounted and soldered to the surface of printed circuit boards, but also integrated into the interior, the cross-section of the printed circuit boards, to an ever greater extent. A conventional method for embedding electronic components in printed circuit boards provides for the creation of clearances or holes in the printed circuit board having the size and shape of the component to be embedded so that, in a subsequent step, the components can be inserted in the respective holes and glued in place there. The disadvantage of gluing the components in the printed circuit board, however, is that the adhesive necessarily represents a different material than the material of the insulating layer in the printed circuit board. While the insulating layers in the printed circuit board are made of prepreg materials, such as FR4, which is to say resin system, adhesives for inserting the components are usually solvent-based. The bonding of components therefore automatically results in inhomogeneities, wherein the relatively strong heating of the components in the printed circuit board during operation results in the formation of cracks over time due to differing coefficients of thermal expansion of the materials that are used, which adversely affects the durability of the printed circuit board, and thus of the corresponding electronic devices.

A method was therefore provided in WO 2012/100274 A1 in which the components are not fixed in the printed circuit board by way of adhesive, but fixation is achieved by way of the resin of the insulating layers of the printed circuit board. In the production of printed circuit boards, the insulating layers, which are made of a prepreg material, are joined to the conducting layers by lamination and compression at elevated temperatures. Prior to the lamination and compression at the elevated temperature, the resin of the prepreg materials is in a non-cured state, which is referred to as the B-stage. B-stage prepregs are stored on rollers while being cooled so as to prevent premature curing of the resin. The method according to WO 2012/100274 A1 now provides for clearances for the components to be created in a combination that comprises curable prepreg material, which is to say B-stage prepreg material, for the components to be mounted in the clearances, and the clearances or openings comprising the components to be covered with further B-stage prepreg layers, and optionally with further contact layers or electrically conducting layers. This combination is subsequently compressed to yield the finished printed circuit board, in which the prepreg material is present in the cured state, the cured state being referred to as the C-stage in professional circles.

The disadvantage with this method is the circumstance that covering the clearances comprising the components with further layers is necessarily required, so that the printed circuit boards produced by way of the method according to WO 2012/100274 A1 were relatively thick, which is contrary to the idea of miniaturization.

SUMMARY OF THE INVENTION

It is therefore the object of the invention to improve a method of the type mentioned above to the effect that the prepreg layers covering clearances and components can be avoided, whereby preferably thin printed circuit boards can be implemented.

So as to achieve this object, according to the invention a method of the type mentioned above is characterized by the following steps:
 a) providing a combination of the layers of the printed circuit board, or of the printed circuit board intermediate product, wherein this combination includes at least one curable prepreg material;
 b) creating a clearance in the combination for accommodating the component to be embedded;
 c) covering at least the region of the clearance with a first temporary carrier layer on a first side of the combination;
 d) positioning the component to be embedded in the clearance by way of the first temporary carrier layer;
 e) covering at least the region of the clearance on the second side of the combination with a second temporary carrier layer;
 f) compressing the combination comprising the component, curing the curable prepreg material; and
 g) removing the temporary carrier layers.

The method according to the invention thus provides a combination of all the layers of the printed circuit board, or of the printed circuit board intermediate product, wherein this combination includes B-stage prepreg material, which is to say prepreg material that still must be cured, in contrast to already cured prepreg material. After the clearance for the component has been created, at least the region of the clearance according to step c) is covered with a first temporary carrier layer, so that the component to be embedded can be mounted on the first temporary carrier layer. Thereafter, the region of the clearance comprising the component positioned therein is covered on the second side of the combination with a second temporary carrier layer. A separating film may be used for this purpose, which may have any arbitrary design, as long as it can be removed after the prepreg material has cured and reached the C-stage. Curing of the prepreg material takes place in step f) and is carried out according to methods that are well-known in the prior art. The combination of the layers of the printed circuit board, or of the printed circuit board intermediate product, comprising the mounted component and the two temporary carrier layers is generally subjected to mechanical pressure and simultaneous heating, whereby cross-linking of the resin of the prepreg material of the insulating layer or of the insulating layers takes place. During compressing according to step f), the resin of the prepreg material flows around the component, meets with a spatial delimitation at the temporary carrier layers, and thus also cures in the region of the components, resulting in a continuous resin phase through the prepreg layers forming the insulating layers of the printed circuit board, or of the printed circuit board intermediate product. In this way, only minor stresses develop during operation of the printed circuit board, as the components heat, which in the absence of an interface, as it occurs in the case of gluing between the adhesive and the resin, can be dissipated directly to the surrounding regions. Since the region of the embedded component did not have to be covered by additional prepreg layers so as to enable compressing, an extremely thin product is yielded after the temporary carrier layers have been removed in accordance with step g), which excellently meets today's requirements in regard to miniaturization.

The method according to the invention is defined with respect to one component that is being embedded. However, it is clear to a person skilled in the art that it is also possible in industrial production to embed a plurality of components in one and the same combination; however, the invention shall be understood such that only one component is inserted in each case in one clearance. The present description may therefore refer to the component in the singular form, or to a plurality of components, which does not change the meaning and the essence of the present invention.

The invention can be based on different types of a combination of the layers of the printed circuit board, or of the printed circuit board intermediate product. According to a preferred variant of the method according to the invention, it is provided that the combination of the layers of the printed circuit board, or of the printed circuit board intermediate product, is composed of a plurality of layers made of a prepreg material. The use of such a combination in step a) of the method according to the invention results in a particularly homogeneous printed circuit board, or in a particularly homogeneous printed circuit board intermediate product, since no conducting layers are present between the layers made of a prepreg material, and the resin of the prepreg material can thus flow unimpaired prior to curing, and can consequently flow around the component to be embedded, or the components to be embedded. After compression and after removal of the temporary carrier layers, this preferred embodiment of the present invention generally requires for the wiring or the routing of the embedded component or components to take place in a subsequent processing step, in which conductor tracks are formed on the outsides according to known methods.

So as to simplify the formation of conductor tracks, the invention is refined according to one preferred embodiment to the effect that the combination of the layers of the printed circuit board, or of the printed circuit board intermediate product, is composed of a plurality of layers made of prepreg material and copper layers located on the outside on both sides. In this case, copper layers are provided on the outside of the printed circuit board, or of the printed circuit board intermediate product, on both sides after compression and after removal of the temporary carrier layers, from which suitable conductor tracks can be formed, for example using photolithography methods.

If the printed circuit board, or the printed circuit board intermediate product, which is to be produced by way of the method according to the invention, is to meet particular requirements in terms the mechanical stability, according to a preferred embodiment of the present invention the combination of the layers of the printed circuit board, or of the printed circuit board intermediate product, can be composed of a plurality of layers made of prepreg material and a central core. In professional circles, a core is understood to mean a layer of a cured prepreg material, such as FR4, having copper layers laminated thereon on both sides. Such cores can be procured industrially as a standard part and offer a certain stability in the method according to the invention already before compressing the curable prepreg material in the combination of the layers of the printed circuit board, or of the printed circuit board intermediate product, which results in improved handling during processing and increased strength of the finished product. The central core may optionally be appropriately structured for the formation of conductor tracks.

According to a further preferred embodiment of the present invention, the combination is composed of a plurality of layers made of prepreg material and a central core, as well as copper layers located on the outside on both sides, which corresponds to a combination of the two preceding variants, whereby a combination of the above-described advantages is achieved.

Moreover, it is conceivable according to a preferred embodiment of the present invention that the combination of the layers of the printed circuit board, or of the printed circuit board intermediate product, is composed of an inside layer made of a prepreg material and cores located on the outside on both sides.

The method according to the invention allows printed circuit boards, or printed circuit board intermediate products, comprising embedded components to be produced in a particularly thin manner. According to a preferred embodiment of the present invention, the method according to the invention is refined to the effect that the combination of the layers of the printed circuit board, or of the printed circuit board intermediate product, essentially has the thickness of the components to be embedded. Insufficient thickness would cause the components to protrude beyond the cross-section of the printed circuit board and consequently prevent these from being entirely encased by the resin of the prepreg material. However, a thickness of the combination of the layers of the printed circuit board, or of the printed circuit board intermediate product, that considerably exceeds the thickness of the components is likewise not necessary to ensure sufficient embedding into the resin of the prepreg material.

As was already mentioned above, the method according to the invention can be applied to a plurality of components, so that a plurality of components are embedded into the printed circuit board. It is essential, however, that the method, as it is defined in the main claim, is carried out for each individual component, so that in each case one clearance is created for a respective component to be embedded.

According to a preferred embodiment of the present invention, it is provided that components having differing thicknesses are mounted in the respective clearances, and the second temporary carrier layer is oriented with a non-adhering surface to the combination of the layers of the printed circuit board, or of the printed circuit board intermediate product. In this case, the thickness of the combination of the layers of the printed circuit board, or of the printed circuit board intermediate product, is selected based on the thickest component, or based on the thickest components, so that thinner components do not extend completely through the cross-section of the combination. For this reason, the second temporary carrier layer must be oriented with a non-adhering surface to the combination of the layers of the printed circuit board, or of the printed circuit board intermediate product, so as to prevent the component from being lifted off the first temporary carrier layer when an adhesive layer is compressed with the second temporary carrier layer.

The first side of the combination is preferably a contact side of the printed circuit board, or of the printed circuit board intermediate product, and the component to be embedded is fixed in the clearance face up with respect to this contact side.

According to a preferred refinement of the present invention, both the first side and the second side of the combination is a contact side of the printed circuit board. In this case, both sides of the printed circuit board can comprise conductor tracks, whereby a highly integrated and thus space-saving printed circuit board is obtained.

This is particularly advantageous when a component having contacts on two opposing sides of the component is being embedded, as is the subject matter of a preferred embodiment of the present invention. This configuration allows current to flow vertically, which is to say current to flow through the cross-section of the printed circuit board, wherein the electronic component serves as a current bridge.

The component is preferably selected from the group consisting an integrated circuit, an LED, a heat sink, a battery, and a printed circuit board, and in particular a multilayer printed circuit board. In particular, the aforementioned component can be any active or passive electronic part. In this connection, the electronic component can also be a fully or partially populated printed circuit board (module) or a MEMS- or MOEMS structure. However, the component may also be a non-electronic component, for example a cooling element, which in particular is made of a metallic material. It is obvious to a person skilled in the art that the method according to the invention can be used to embed any type of electronic component, so that this enumeration shall not be considered to be exhaustive.

According to a particularly preferred embodiment of the present invention, the component is an IMS component. The abbreviation IMS denotes "insulated metal substrate" and refers to a component in which a thin insulator layer, for example epoxy resin-based, is disposed between a thick, metallic base layer, for example made of aluminum or copper, and a relatively thin conducting layer, for example made of aluminum or copper. IMS components are used for contacting and the simultaneous cooling of power components, since the conducting layer, on the one hand, can be structured to obtain contact areas and conductor tracks and, on the other hand, is electrically insulated with respect to the base layer by the insulator layer, wherein the insulator layer ensures good heat transfer to the base layer where the heat developed by the power component can be dissipated.

The first temporary carrier layer is preferably designed in the form of an adhesive tape. The adhesive action of the adhesive tape positions or temporarily fastens the components, wherein however the second temporary carrier layer does not necessarily have to be an adhesive tape.

DESCRIPTION OF THE DRAWINGS

The invention will be described hereafter in greater detail based on one exemplary embodiment shown schematically in the drawings. In the drawings.

DETAILED DESCRIPTION OF THE INVENTION

FIGS. 1 a) to 1 e) show variants of the combination of the layers of the printed circuit board, or of the printed circuit board intermediate product, as they can be provided within the scope of the present invention according to step a). FIG. 1*a*) shows a combination 100 that is only composed of layers made of a prepreg material 1 (prepreg layers); FIG. 1*b*) shows a combination 100 that is composed of prepreg layers 1 and copper layers 2 located on the outside on both sides; FIG. 1*c*) shows a combination 100 that is composed of prepreg layers 1 located on the outside and a central core 3; FIG. 1*d*) shows a combination 100 that is composed of cores 3 located on the outside on both sides and an inside prepreg layer 1; and FIG. 1 *e*) shows a combination 100 that is composed of an inner core 3, a plurality of layers made of prepreg material 1, and copper layers 2 located on the outside on both sides.

Figure 1A:
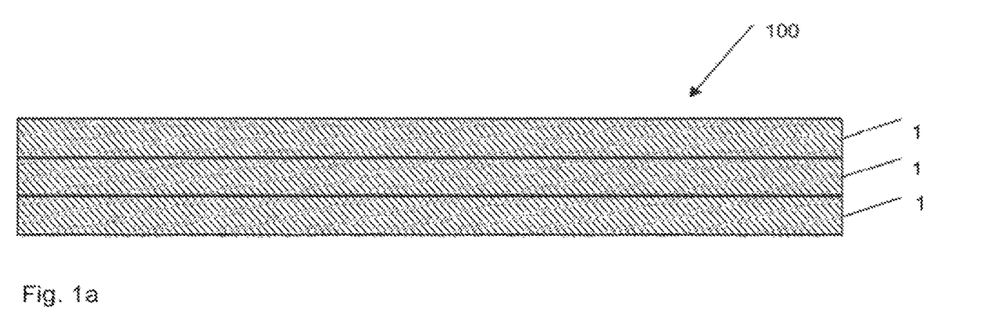
FIGS. 1a) to 1e) show variants of a combination of the layers of the printed circuit board, or of the printed circuit board intermediate product, according to step a) of the method according to the invention.
Figure 1B:
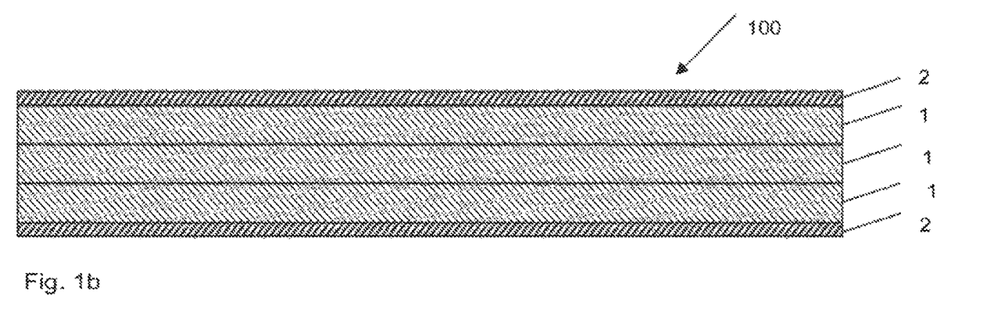
Figure 1C:
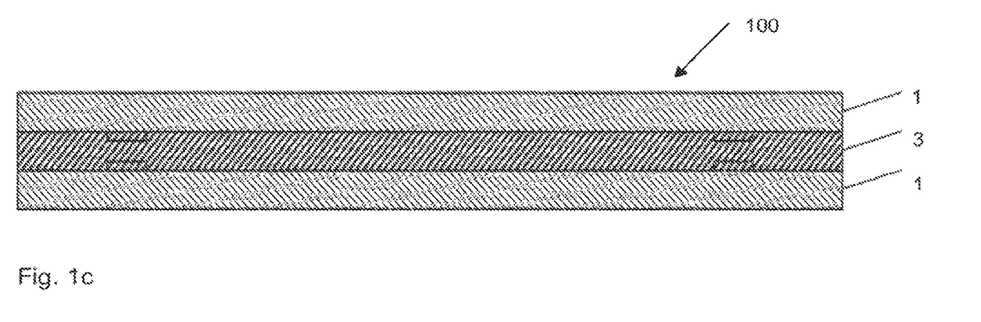
Figure 1D:
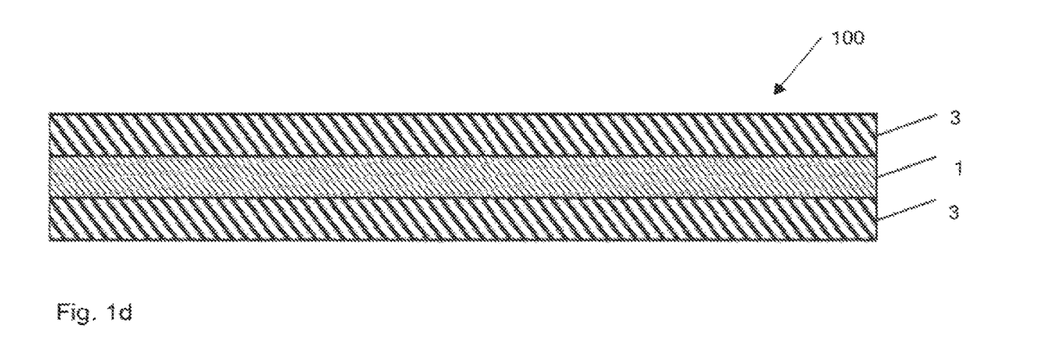
Figure 1E:
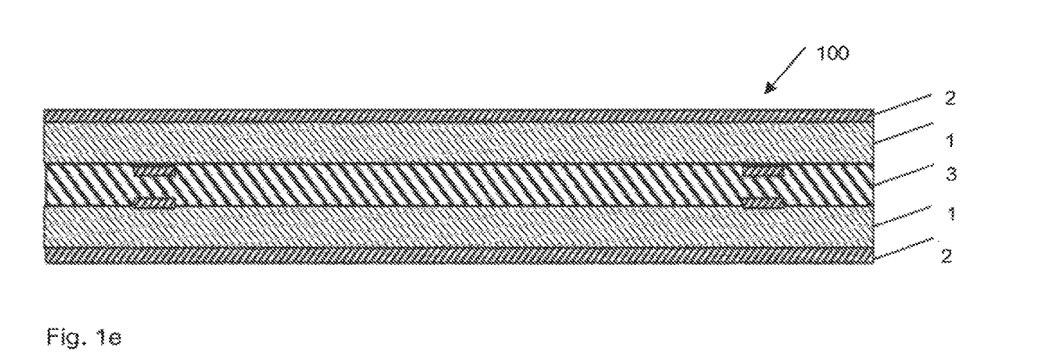
Figure 2:
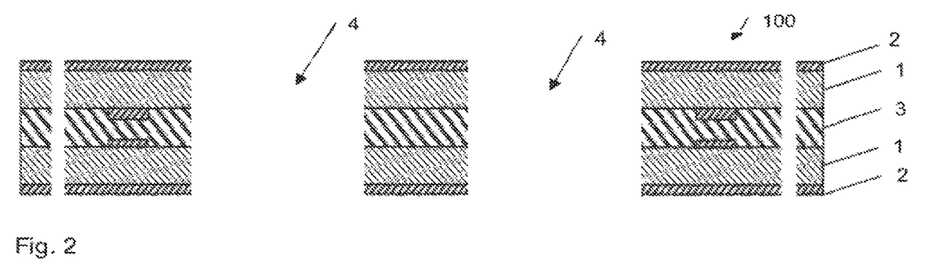
FIG. 2 shows an illustration of step b) of the method according to the invention.
Figure 3:
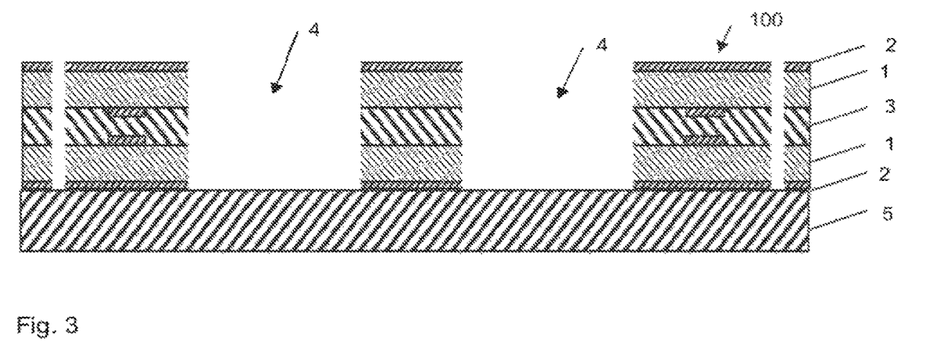
FIG. 3 shows an illustration of step c) of the method according to the invention.
Figure 4:
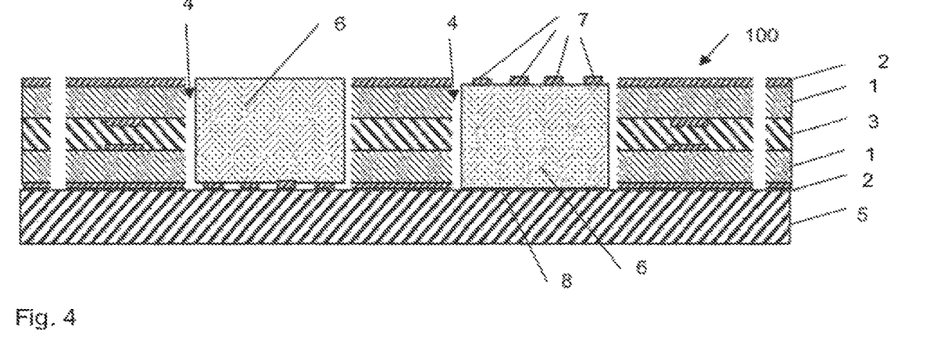
FIG. 4 shows an illustration of step d) of the method according to the invention.

FIG. 2 shows, by way of example, a combination 100 as in FIG. 1*e*), illustrated according to step b) with clearances 4 for accommodating the components to be embedded. After the clearances 4 have been created, according to step c) the clearances 4 in the combination 100 are covered with a first temporary carrier layer 5, for example in the form of an adhesive tape on one side of the combination 100 (FIG. 3). According to step d) and as shown in FIG. 4, the components 6 to be embedded are mounted in the clearances 4 or positioned in these in a next method step. As is apparent from FIG. 4, the components can be positioned either "face down" or "face up", wherein in the first case they adhere with the contact side thereof, or with the contact pads 7 thereof, and in the second case they adhere with the back side 8 thereof, to the first temporary carrier layer, which is present on this first side of the combination in the form of an adhesive tape.

To carry out the method according to the invention, it is essentially only necessary to cover at least the region of the clearance, or the regions of the clearances, with a first temporary carrier layer 5. In industrial production, however, it is usually easier to cover not only the region or the regions of the clearances with a first temporary carrier layer, but the entire surface area of the combination 100 with a continuous first temporary carrier layer 5.

Figure 5:
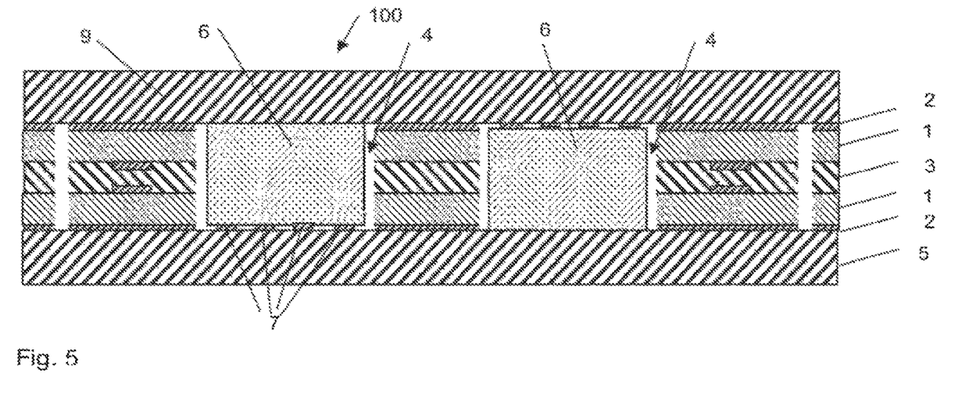
FIG. 5 shows an illustration of step e) of the method according to the invention.

It is now apparent in FIG. 5 that, according to step e), the regions of the clearances on the second side of the combination 100 are covered with a second temporary carrier layer 9, wherein it is usually more economical here as well to cover not only the region of the clearance, or the regions of the clearances, but to apply a continuous second temporary carrier layer 9 across the entire surface area of the combination 100.

Figure 6:
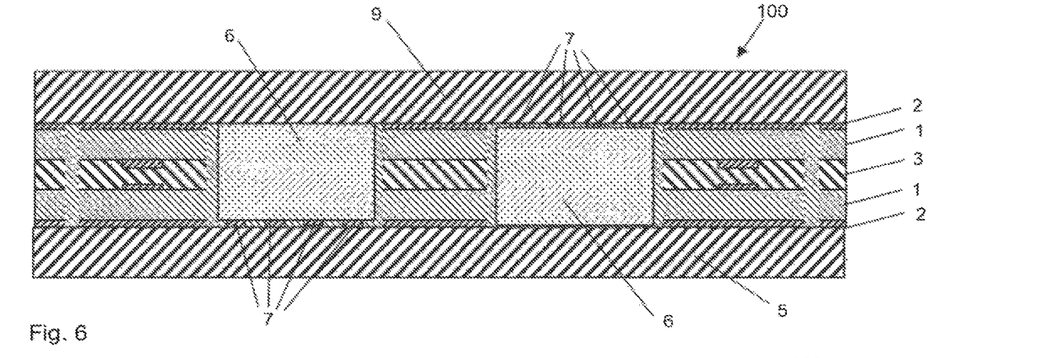
FIG. 6 shows an illustration of step f) of the method according to the invention.
Figure 7:
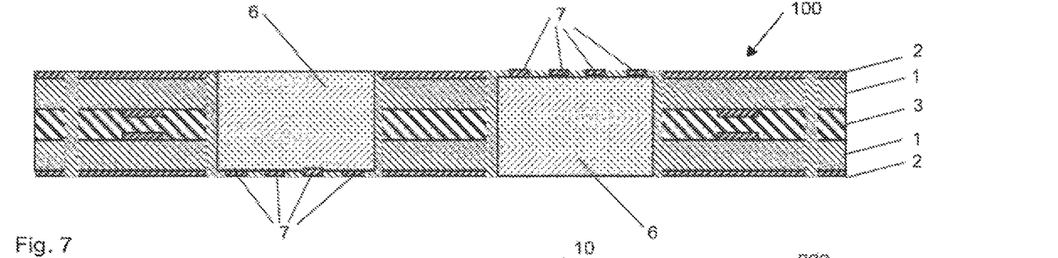
FIG. 7 shows an illustration of step g) of the method according to the invention.
Figure 8:
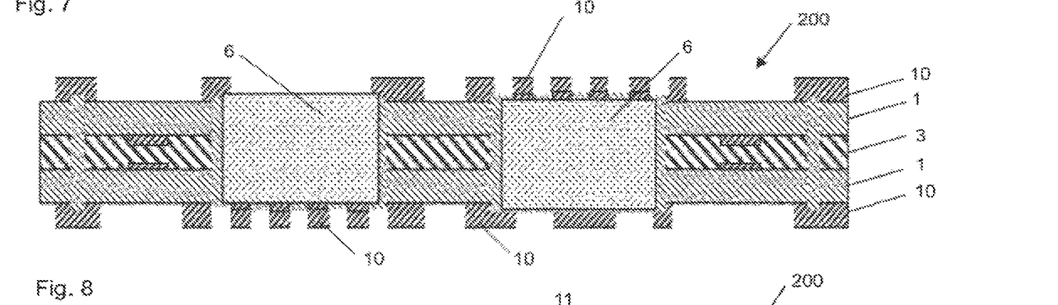
FIG. 8 shows a possible way of further processing the printed circuit board, or the printed circuit board intermediate product, produced by the method according to the invention, including a contacting of the embedded component in the plane of the contact pads of the embedded components.
Figure 9:
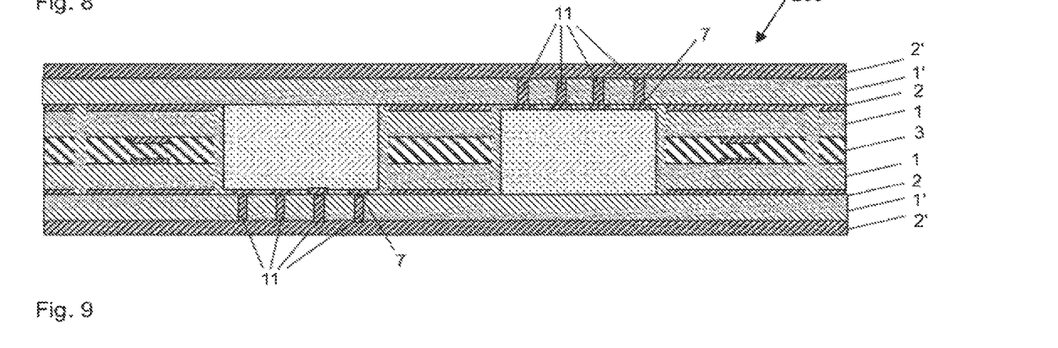
FIG. 9 shows a possible way of further processing the printed circuit board, or the printed circuit board intermediate product, produced by the method according to the invention, including a contacting in a contact layer located above the plane of the contact pads of the embedded components.

FIG. 6 shows step f) of the method according to the invention, which is to say the compressing of the combination comprising the component or the components, curing the curable prepreg material 1. As is apparent from FIG. 6, the cavities of the clearances 4 are filled with resin of the layers made of prepreg material 1, so that reliable fixation of the components 6 in the combination 100 takes place during curing. Since the first temporary carrier layers 5 and 9 reliably delimit the combination 100 in spatial terms, the contact pads 7 of the components 6 are exposed after the temporary carrier layers 5 and 9 have been removed (FIG. 7) in the variant shown in the above figures for populating the combination 100 with components 6 and can, as is shown in FIG. 8, be used directly for contacting and creating conductor tracks 10, which are not shown in detail here, in the same plane a or a' of the printed circuit board, or of the printed circuit board intermediate product 200. According to the variant shown in FIG. 9, however, a further composition of the printed circuit board intermediate product 200 can be created by applying further layers made of prepreg material 1' and contact layers or copper layers 2' using known methods, wherein in this case the contacting of the contact pads 7 of the components 6 takes place via what are known as microvias 11

Figure 10:
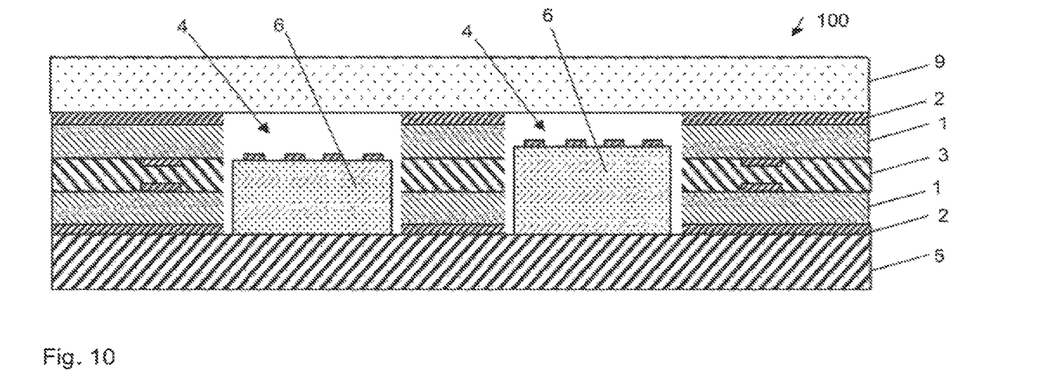
FIG. 10 shows an illustration corresponding to step e) of the method according to the invention, wherein components of differing thicknesses were positioned in the clearances.
Figure 11:
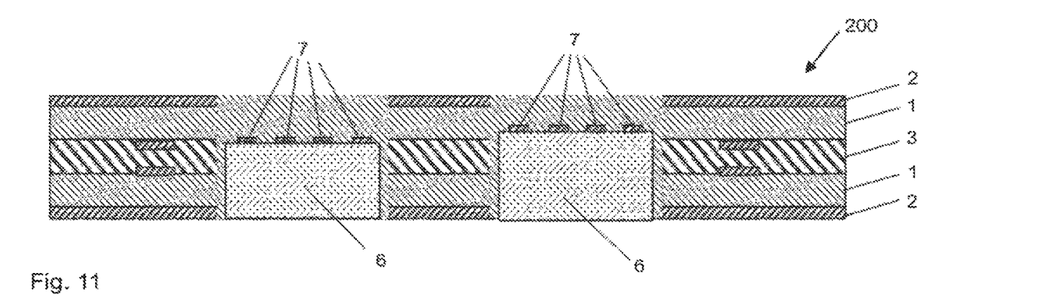
FIG. 11 shows the further processing of the intermediate product according to FIG. 10 as defined by steps f) and g) of the method according to the invention.
Figure 12:
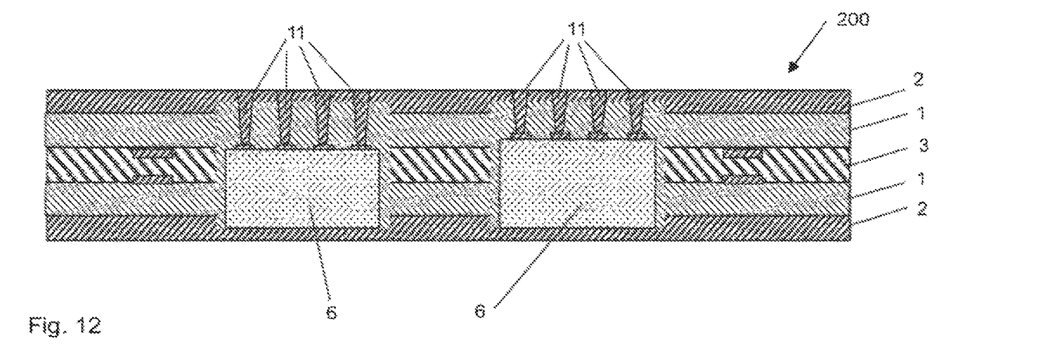
FIG. 12 shows a possible way of contacting the components embedded according to FIGS. 10 and 11.
Figure 13:
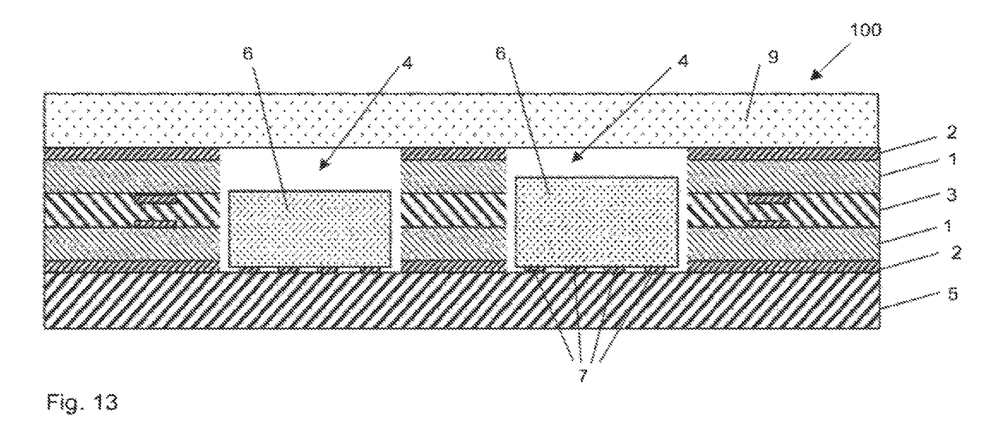
FIG. 13 shows an illustration of one variant in which variably thick components having the contact side in the direction of the first temporary carrier layer are positioned in the clearances.
Figure 14:
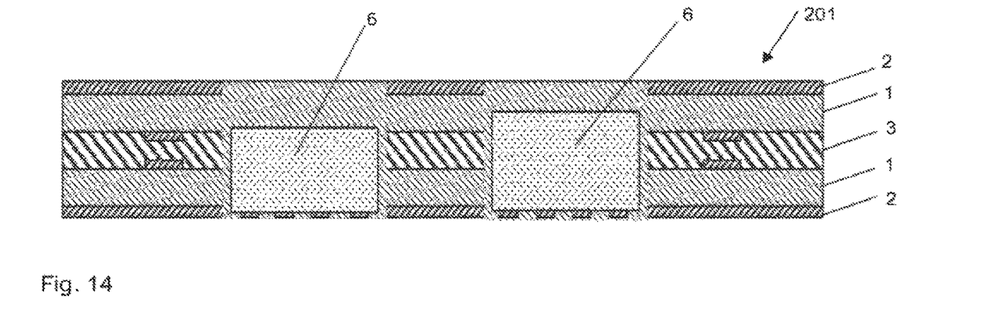
FIG. 14 shows an illustration of the result of the further processing according to the invention of the semi-finished product according to FIG. 13.

It is apparent from FIG. 10 that components 6 having differing thicknesses can be mounted in the clearances 4 or be positioned in these, wherein in this case the second temporary carrier layer 9 is not an adhesive tape due to the circumstance that a distance exists between the components 6 and the second temporary carrier layer, and the components 6 must not be lifted off the first temporary carrier layer 5 during compression. After compressing according to step f) of the method according to the invention, a printed circuit board, or a printed circuit board intermediate product 200 is obtained, as is shown in FIG. 11, wherein a contacting of the component 6 again takes place via microvias 11 (FIG. 12). When mounting differently thick components 6 in the clearances 4 with the contact pads in the direction of the first temporary carrier layer 5, which is present in the form of an adhesive tape, the second temporary carrier layer must have a non-adhesive surface, which is oriented to the combination 100 of the layers of the printed circuit board, or of the printed circuit board intermediate product (FIG. 13). After compressing according to step f) of the method according to the invention, a printed circuit board intermediate product 201 (FIG. 14) is obtained, which can in turn be contacted again according to FIG. 8.

Figure 15:
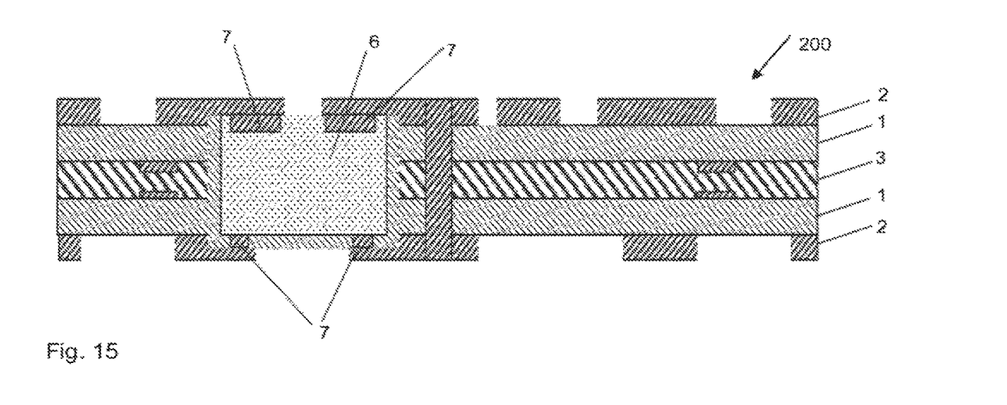
FIG. 15 shows a variant of a printed circuit board, or of a printed circuit board intermediate product, produced by the method according to the invention.

FIG. 15 shows a variant of the present invention in which a component 6 comprising contacts 7 on two opposing sides was embedded, whereby a vertical flow of current from one side to the other side of the printed circuit board 200 is enabled.

Figure 16:
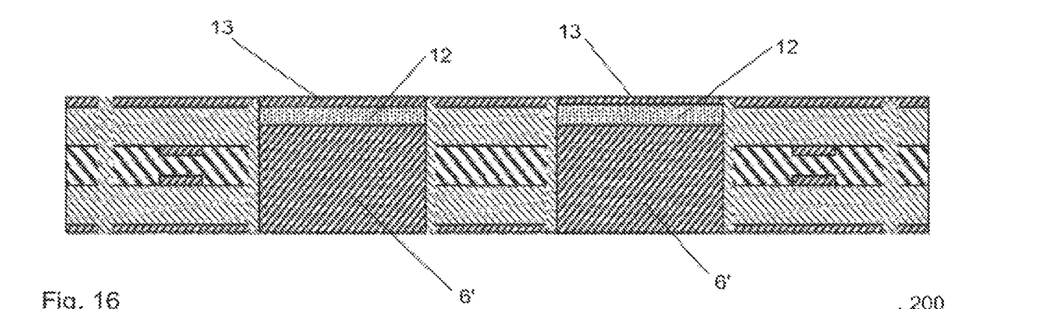
FIGS. 16 to 19 show variants of the present invention using an IMS part as the component to be embedded.
Figure 17:
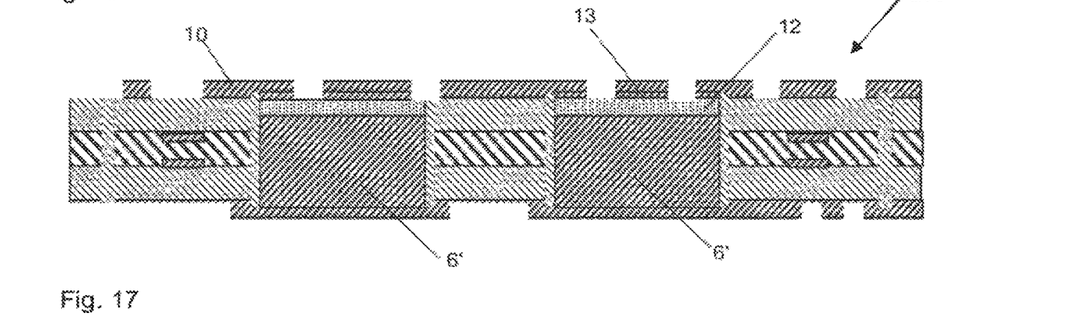
Figure 18:
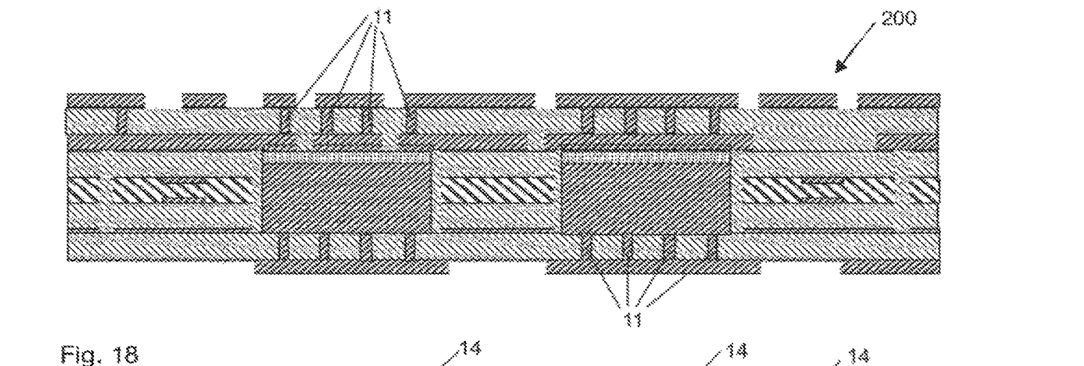

According to a preferred embodiment of the present invention, in FIG. 16 the components 6 are formed by IMS parts 6', wherein the insulator layer of the IMS part 6' is denoted by numeral 12 and the conducting layer is denoted by numeral 13. The IMS part 6' can be contacted in the conventional manner, wherein contacting via microvias 11 is also possible (FIG. 18).

Figure 19:
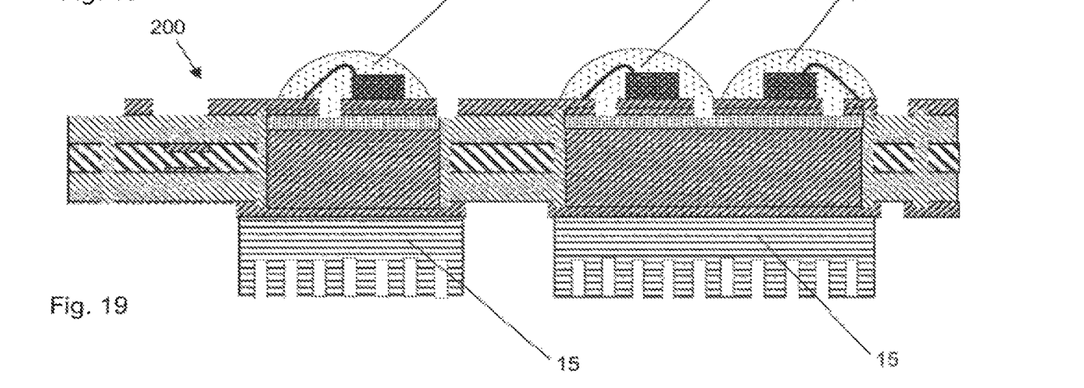

The use of IMS parts is particularly suited for dissipating heat, and in the case shown in FIG. 19 of heat that is introduced by LED units 14 into the printed circuit board intermediate product 200. FIG. 19 shows heat sinks 15, which additionally dissipate the heat dissipated via the IMS components 6'.

The invention claimed is:

1. A method of manufacturing a printed circuit board or a printed circuit board intermediate product, the method comprising steps of:
    providing a combination of layers having a first and second outer surface, wherein the combination of layers comprises at least one insulating layer and at least one first metal layer, wherein the at least one first metal layer is disposed on and runs parallel to the at least one insulating layer and forms at least one of the first and second outer surfaces of the combination of layers;
    embedding a component in a clearance passing through all the layers comprised in the combination of layers, the component having at least one first contact pad in the combination of layers such that the at least one first contact pad intersects the first horizontal plane of the at least one first metal layer;
    arranging a first further metal layer which directly connects the at least one first contact pad to the at least one first metal layer without interposing any insulating layer between the at least one first metal layer and the first further metal layer;

wherein the at least one first metal layer and the first further metal layer form a combined metal layer structure comprising a thinned portion in an area adjacent to the clearance,
wherein the thinned portion bridges the at least one first contact pad and the at least one first metal layer; and
wherein the combination of layers comprises at least one layer made of curable prepreg material;
wherein the component is embedded in the clearance by a resin from the at least one layer made of curable prepreg material, wherein the same resin contacts a lower surface of the first metal layer, a lower surface of the first further metal layer, and a sidewall of the component.

2. The method according to claim 1, wherein the first further metal layer is arranged to directly connect the at least one first contact pad to a first contact portion of the at least one first metal layer.

3. The method according to claim 1, wherein
the at least one insulating layer is made of the curable prepreg material.

4. The method according to claim 1, wherein
the combination of layers includes at least one second metal layer extending along a second horizontal plane in parallel to at least one of the first and second main surfaces;
wherein the component is embedded in the combination of layers such that at least one second contact pad intersects the second horizontal plane; and
arranging a second further metal layer which directly connects the at least one second contact pad to the at least one second metal layer without interposing any insulating layer between the at least one second metal layer and the second further metal layer.

5. The method according to claim 4, wherein
the second further metal layer is arranged to directly connect at least one second contact pad to a second contact portion of the at least one second metal layer without interposing any insulating layer between the at least one second metal layer and the second further metal layer within a horizontal area between the at least one second contact pad and the second contact portion.

6. The method according to claim 1, wherein
a plurality of the components is embedded in the combination of layers.

7. The method according to claim 6, comprising:
embedding another component in the combination of layers, wherein the component and the other component have different thicknesses.

8. The method according to claim 1, wherein the component is selected from the group consisting an IMS part, a copper inlay, an integrated circuit, an LED, a heat sink, a battery, and a printed circuit board.

9. The method according to claim 1, wherein
the combination comprises a core having a first core main surface and a second core main surface, the at least one insulating layer being a first insulating layer arranged at the first core main surface, wherein the core and the first insulating layer form a stack; and
the component is embedded in the stack.

10. The method according to claim 9, further comprising:
arranging a second insulating layer at the second core main surface, the second insulating layer being part of the stack.

* * * * *